US007042550B2

(12) United States Patent
Lowisch et al.

(10) Patent No.: US 7,042,550 B2
(45) Date of Patent: May 9, 2006

(54) DEVICE MANUFACTURING METHOD AND COMPUTER PROGRAM

(75) Inventors: Martin Lowisch, Oberkochen (DE); Marcel Mathijs Theodore Marie Dierichs, Venlo (NL); Koen Van Ingen Schenau, Eindhoven (NL); Hans Van Der Laan, Veldhoven (NL); Martinus Hendrikus Antonius Leenders, Rotterdam (NL); Elaine McCoo, Veldhoven (NL); Uwe Mickan, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 162 days.

(21) Appl. No.: 10/716,939

(22) Filed: Nov. 20, 2003

(65) Prior Publication Data

US 2004/0137677 A1 Jul. 15, 2004

(30) Foreign Application Priority Data

Nov. 28, 2002 (EP) .................................. 02258208

(51) Int. Cl.
*G03B 27/42* (2006.01)
*G03B 27/32* (2006.01)
*G03F 1/00* (2006.01)

(52) U.S. Cl. ................................ 355/53; 355/77; 430/5

(58) Field of Classification Search .................. 355/53, 355/71, 77; 430/5; 359/730, 731, 857, 858, 359/859

See application file for complete search history.

(56) References Cited

U.S. PATENT DOCUMENTS

| | | | | |
|---|---|---|---|---|
| 5,789,734 | A | 8/1998 | Torigoe et al. | |
| 6,057,914 | A * | 5/2000 | Yedur et al. | 356/124 |
| 6,078,380 | A | 6/2000 | Taniguchi et al. | |
| 6,115,108 | A | 9/2000 | Capodieci | |
| 6,673,638 | B1 * | 1/2004 | Bendik et al. | 438/14 |
| 6,809,797 | B1 * | 10/2004 | Baselmans et al. | 355/52 |
| 2003/0003383 | A1 * | 1/2003 | Van Der Werf et al. | 430/22 |
| 2004/0091789 | A1 * | 5/2004 | Han et al. | 430/5 |

FOREIGN PATENT DOCUMENTS

| | | | |
|---|---|---|---|
| EP | 1 251 402 | A1 | 10/2002 |
| EP | 1 271 247 | A1 | 1/2003 |

OTHER PUBLICATIONS

Katsura Otaki, "Asymmetric Properties of the Aerial Image in Extreme Ultraviolet Lithography," *Jpn. J. Appl. Phys.* 39:6819-6826 (2000).

Chen et al., "Simulation on a New Reflection Type Attenuated Phase Shifting Mask for Extreme Ultraviolet Lithography," *SPIE*, vol. 3676, Mar. 1999, pp. 578-586.

* cited by examiner

*Primary Examiner*—Alan Mathews
(74) *Attorney, Agent, or Firm*—Pillsbury Winthrop Shaw Pittman, LLP

(57) ABSTRACT

System aberrations are effected in a projection system of a lithographic apparatus to optimize imaging of a thick reflective mask with a thick absorber that is obliquely illuminated. The aberrations may include Z5 astigmatism, Z9 spherical, and Z12 astigmatism.

19 Claims, 10 Drawing Sheets

Addition of aberration to correct for BFshift due to mask : starting position - 30nm Bright Field Effect of BFshift correction on IFT : starting position - 30nm Bright Field Addition of aberration to correct for BFshift due to mask :
Z5-0.26nm and Z9-0.24nm and Z12-0.07nm -30nm Bright Field Effect of BFshift correction on IFT :
Z5-0.26nm and Z9-0.24nm and Z12-0.07nm - 30nm Bright Field Addition of aberration to correct for BFshift due to mask :
Z5-0.18nm and Z9-0.22 and Z12-0.18nm - 50nm Bright Field Correction of IFT without impact on BFshifts :
Z5-0.4nm and Z9-0.55nm and Z12-0.11nm - 30nm Bright Field 30nm IL NA/s=0.25/0.5 6 degrees mask incidence
Solid-EUV & EUV2D - TILT CORRECTED 30nm IL NA/s=0.25/0.5 0 degrees mask incidence
Solid-EUV & EUV2D

DEVICE MANUFACTURING METHOD AND COMPUTER PROGRAM

BACKGROUND OF THE INVENTION

This application claims priority from European Patent Application 02258208.4, filed Nov. 28, 2002 which is herein incorporated by reference in its entirety.

1. Field of the Invention

The present invention relates generally to a device manufacturing method using a lithographic apparatus and more particularly to computer programs for use in controlling lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

To enable imaging of smaller features than is possible with current lithographic projection apparatus, it is proposed to use extreme ultraviolet radiation (EUV), e.g. with a wavelength of 13.5 nm, as the exposure radiation. Such radiation is strongly absorbed by almost all known materials and so a reflective mask is used. However, making a reflective mask for EUV presents its own problems and to achieve an acceptable reflectance, the mask is formed as a distributed Bragg reflector formed by a multilayer of 40 or more layer pairs of, for example, (Mo/Si) or (Mo/Be). The mask pattern is then formed by an overlying patterned absorber layer such as Tantalum (Ta) or Chromium (Cr). The multilayer and absorber layer must be relatively thick, many tens of wavelengths, and this, coupled with the necessity to illuminate the mask obliquely, introduces various errors in the projected image, as compared to an ideal, thin binary mask.

These errors are discussed in various publications. B. S. Bollepalli and F. Cerrina, *On the Computation of Reflected Images from Extreme Ultra Violet Masks*, SPIE Conference on Emerging Lithographic Technologies III, Santa Clara, Calif., SPIE Volume 3676, 587–597 (March 1999) describes variation of line widths and pattern shifts with angle of incidence of isolated structures and proposes correction by a suitable mask bias. C. G. Krautschik, M. Ito, I. Nishiyama, and K. Otaki, *Impact of the EUV mask phase response on the asymmetry of Bossung curves as predicted by rigorous EUV mask simulations*, SPIE Conference on Emerging Lithographic Technologies V, Santa Clara, Calif., SPIE Volume 4343 (March 2001) describes asymmetry of the Bossung curve through focus for isolated structures and indicates that different illumination angles experienced by horizontal and vertical lines causes an additional horizontal to vertical CD bias through focus. Again, it is proposed to compensate for these effects through mask-sizing schemes. K Otaki, *Asymmetric properties of the Aerial Image in Extreme Ultraviolet Lithography*, Jpn. J. Appl. Phys. Vol 39 (2000) pp 6819–6826, describes the influence of asymmetric diffraction when a thick mask is asymmetrically illuminated and notes the asymmetry in the aerial image.

EP-1 251 402-A discloses the idea of deliberately introducing aberrations into a projection lens to compensate for other aberrations already present so as to minimize a merit function. Also disclosed is to compensate for Bossung tilt deriving from deviations from the correct 180° phase shift in a phase-shift mask (PSM). However, the solutions proposed in the prior art do not provide complete solutions and cannot compensate for all mask-induced imaging artifacts.

SUMMARY OF THE INVENTION

One aspect of embodiments of the present invention provides a device manufacturing method using a reflective mask illuminated at an angle to normal in which improved imaging is obtained.

According to an aspect of the invention, there is provided a device manufacturing method including providing a substrate that is at least partially covered by a layer of radiation-sensitive material, providing a projection beam of radiation using a radiation system, using a reflective mask on which a pattern is defined by a thick absorber to endow the projection beam with said pattern in its cross-section, and projecting the patterned beam of radiation onto a target portion of the layer of radiation-sensitive material, wherein system aberrations in the projection system used in the projecting the patterned beam are controlled or created to compensate for mask-induced imaging artifacts.

In the method of one embodiment of the invention, it is possible to compensate for best focus shift effects due to a reflective mask with a thick absorber and oblique illumination in such a way that best focus shift differences between dense and isolated lines, and between horizontal and vertical lines, can be reduced. A thick absorber for use with EUV radiation may, for example, have a thickness of 50–100 nm or more. The invention uses any available "knobs" in the projection system to effect wavefront or phase manipulation to correct any correctables in the image shape. This assists in bringing process windows for different features closer together. It is also possible to use iso-focal tilt as the metric for level of aberration input and reduce the differences between different structure types. The choice of metric is important as improvement in isofocal tilt may worsen best focus shift performance, and vice versa.

The method of the present invention can also compensate for mask-induced image CD offset, which occurs as a function of mask angle of incidence (MAI), absorber thickness, feature type and NA/illumination settings. The dominant effect is a CD variation between features as a function of structural orientation, for example a horizontal-vertical (HV) bias varying across the image field. For contact holes, the mask will induce ellipticity variation across the image field.

Preferably, the low order system aberrations are Z5 astigmatism, Z9 spherical, and Z12 astigmatism (as defined below) or equivalent aberrations. Simulations of dense and semi-isolated structures, with and without aberrations, have provided sensitivity data for best focus (BF) shift and isofocal tilt (IFT). Optimized combinations of Zernikes Z5, Z9 and Z12 can compensate for, and reduce, best focus shifts and isofocal tilt to bring focus positions of dense, semi-isolated, horizontal and vertical lines of same critical dimension (CD) closer together. Thus, the possibility of overlapping process windows for imaging is enhanced. The effect of using such best focus shift compensation can also have a positive effect on isofocal tilt but this is feature dependent. Contact hole ellipticity variation across the image field can be compensated for using mostly Z5 astigmatism. HV bias variation can be compensated for in combination with best focus shift and iso-focal tilt using principally combinations of Z5, Z9 and Z12 aberrations.

A further problem that aspects of embodiments of the invention may address is image displacement in the XY plane. Such displacements may occur as a function of mask angle of incidence, absorber thickness, feature type and NA/illumination settings and the displacements will be dependent on position in the image field. While such effects may be compensated for in some cases by pre-distortion of the mask and by optical proximity corrections, these solutions tie the mask to use with a particular set of machine settings. A more flexible solution can be provided by the invention by controlling and/or introducing projection system aberrations, particularly Z2, Z3, and Z7 (as defined below).

A further aspect of embodiments of the present invention provides a computer program for determining system aberrations to be effected in a projection system of a lithographic apparatus to optimize imaging of a reflective mask embodying a mask pattern in a thick absorber, the program comprising code that, when executed on a computer system, instruct the computer to perform a method including determining the sensitivities of different features in said pattern to different aberrations, and determining the optimum combination of aberrations using the determined sensitivities.

Another aspect of embodiments of the invention provides a computer program for controlling a lithographic projection apparatus to effect system aberrations in the projection system of the lithographic projection apparatus to optimize imaging of a reflective mask embodying a mask pattern in thick absorber.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms “wafer” or “die” herein may be considered as synonymous with the more general terms “substrate” or “target portion”, respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms “radiation” and “beam” used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term “patterning means” or “patterning structure” used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular fuinctional layer in a device being created in the target portion, such as an integrated circuit.

Patterning structures may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning means, the support structure may be a frame or table, for example, which may be fixed or movable as required and which may ensure that the patterning means is at a desired position, for example with respect to the projection system. Any use of the terms “reticle” or “mask” herein may be considered synonymous with the more general term “patterning means”.

The term “projection system” used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term “lens” herein may be considered as synonymous with the more general term “projection system”.

The illumination system may also encompass various types of optical components, including refractive, reflective, and catadioptric optical components for directing, shaping, or controlling the projection beam of radiation, and such components may also be referred to below, collectively or singularly, as a “lens”.

The lithographic apparatus may be of a type having two (dual stage) or more substrate tables (and/or two or more mask tables). In such “multiple stage” machines the additional tables may be used in parallel, or preparatory steps may be carried out on one or more tables while one or more other tables are being used for exposure. The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Lithographic Projection Apparatus

Figure 1:
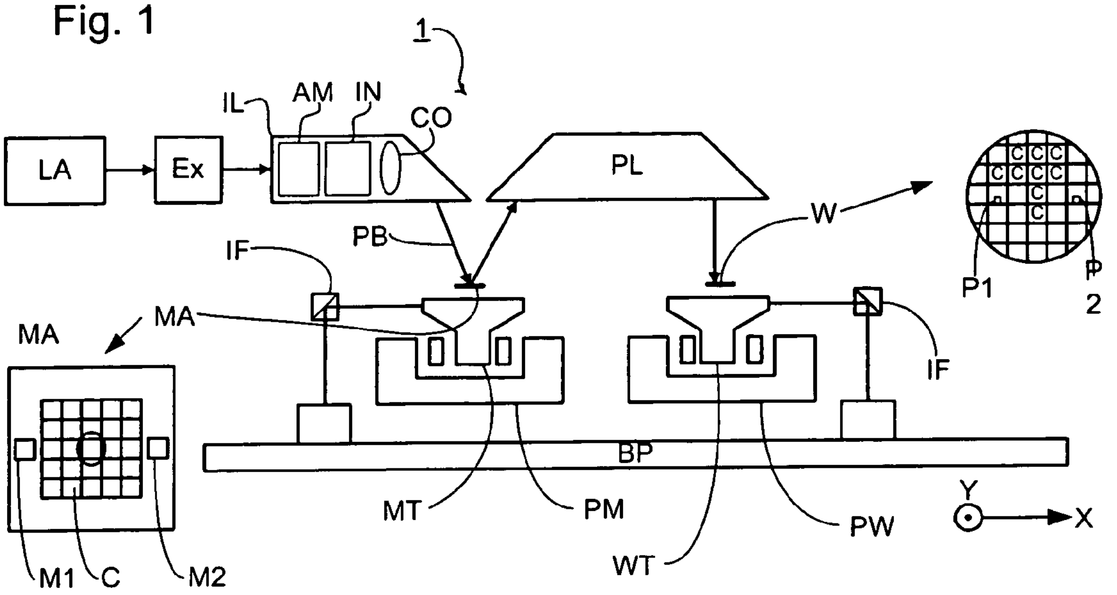
FIG. 1 depicts a lithographic projection apparatus that may be used to carry out the method of the invention.

FIG. 1 schematically depicts a lithographic projection apparatus that may be used to perform the method of the invention. The apparatus comprises:

- an illumination system (illuminator) IL for providing a projection beam PB of radiation (e.g. EUV radiation);
- a first support structure (e.g. a mask table in turn supported by a base plate BP) MT for supporting patterning means (e.g. a mask) MA and connected to first positioning means PM for accurately positioning the patterning means with respect to item PL;
- a substrate table (e.g. a wafer table) WT for holding a substrate (e.g. a resist-coated wafer) W and connected to second positioning means PW for accurately positioning the substrate with respect to item PL; and
- a projection system (e.g. a reflective projection lens) PL for imaging a pattern imparted to the projection beam PB by patterning means MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source LA. The source and the lithographic apparatus may be separate entities, for example when the source is a plasma discharge source. In such cases, the source is not considered to form part of the lithographic apparatus and the radiation beam is generally passed from the source LA to the illuminator IL with the aid of a radiation collector comprising for example suitable collecting mirrors and/or a spectral purity filter. In other cases the source may be integral part of the apparatus, for example when the source is a mercury lamp. The source LA and the illuminator IL, may be referred to as a radiation system.

The illuminator IL may comprise adjusting means for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning means PW and position sensor IF2 (e.g. an interferometric device), the substrate table WT can be moved accurately, e.g. so as to position different target portions C in the path of the beam PB. Similarly, the first positioning means PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

Figure 2:
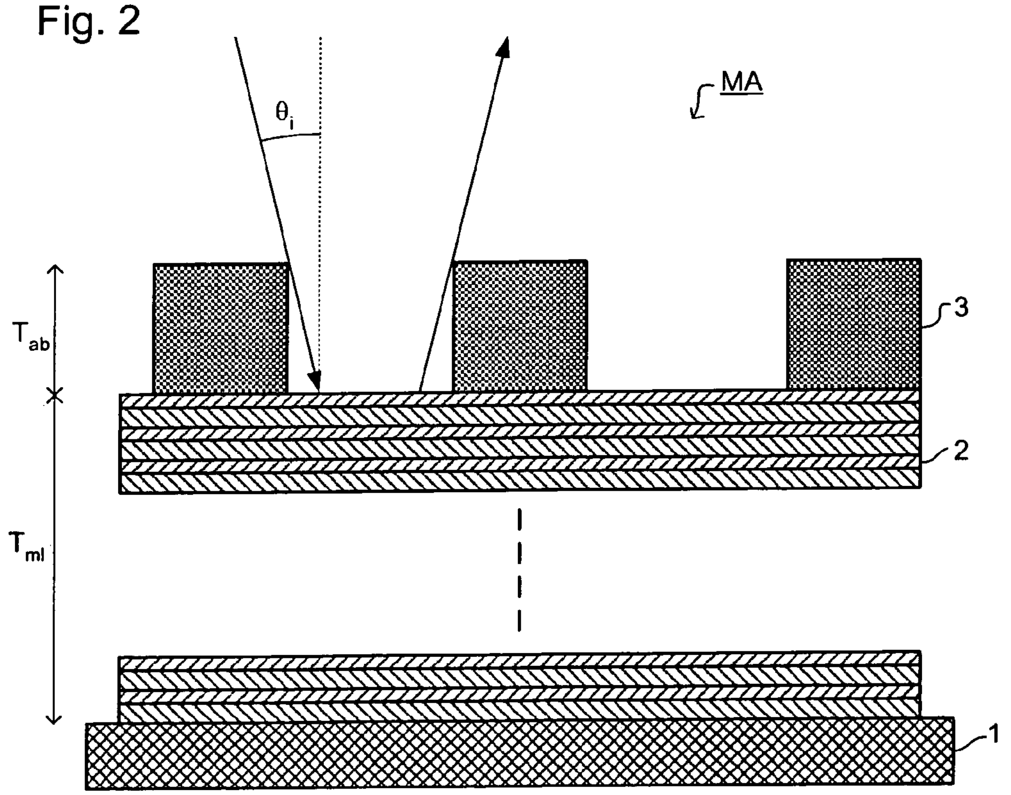
FIG. 2 depicts a reflective multilayer mask that may be used in the method of the invention.

FIG. 2 shows the mask MA, which comprises a substrate 1 on which is provided a multilayer 2 forming a distributed Bragg reflector overlain by a patterned absorber layer 3. The multilayer may comprise 40 or more periods of alternating layers of Molybdenum (Mo) and Silicon (Si) or Molybdenum and Beryllium (Be). Other materials and three or four layer periods may also be used. Further details of suitable reflectors formed of multilayer stacks may be found in EP-A-1 065 532, EP-A-1 065 568 and EP-A-1 260 862, which documents are hereby incorporated by reference. Each period of the multilayer is approximately half a wavelength thick so that the total thickness of the multilayer, $T_{ml}$, is about 270 nm or more. Absorber layer 3 may be formed of Chromium (Cr), Tantalum (Ta) or other Ta containing materials such as TaBN. To provide a sufficient degree of absorption, its thickness, $T_{ab}$, is 50 or 100 nm or more.

Because the illumination and projection systems are formed of reflective optical elements, the mask should be illuminated obliquely, e.g. at an angle, $\theta_i$, of about 6° to the normal.

The combination of the oblique illumination and the thickness of the multilayer and absorber layer causes a number of deformations in the projected image, as compared to the image that would be produced by an ideal, thin binary mask. As can be seen, the shadowing effect of the thick absorber will cause opaque features to be imaged with greater width than the feature on the mask and this effect will differ between horizontal and vertical features because of the different effective angle of illumination. The thickness of the multilayer and the extent to which the illumination radiation penetrates the multilayer further complicates the situation and introduces various imaging artifacts.

The various effects of the thick, reflective mask can be simulated and are found to be pattern dependent—the effects on vertical and horizontal lines differ and the effects are different according to pattern density for example. The resulting deformations of the aerial images may be characterized as or approximated by aberrations, which can be expressed in terms of Zernike polynomials. According to the invention, aberrations in the projection system are introduced and/or controlled to counteract the effects of the mask thickness and oblique illumination.

The aberrations may be introduced or controlled by control of the position and/or orientations of the individual mirrors of the projection system and the mask and substrates. Positioning systems for the individual mirrors of the projection system are included in an EUV lithographic projection system to provide the necessary image stability and may be used to effect the aberration control of the present invention without further modification, simply by the use of different setpoints. The present invention may, alternatively or in addition, make use of adaptive mirrors, such as described in EP-A-1174 770, which document is hereby incorporated by reference.

Figure 3:
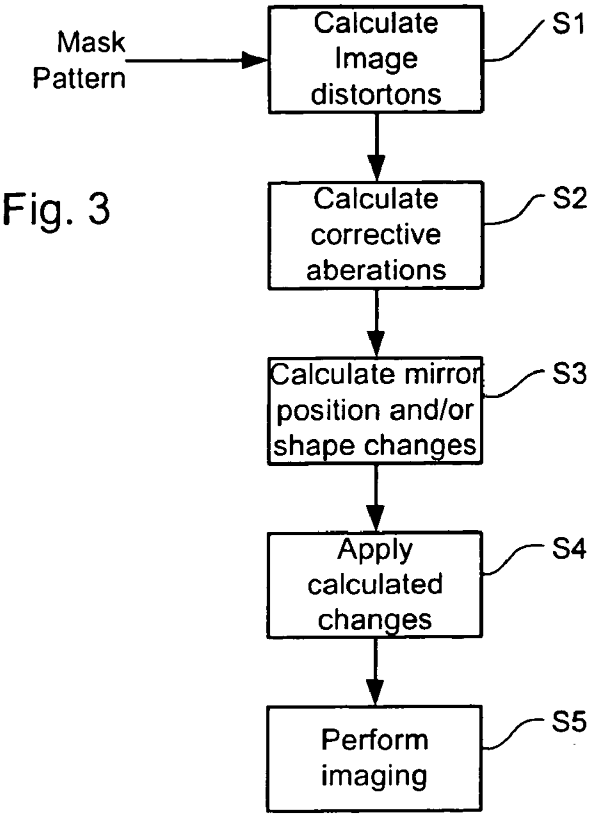
FIG. 3 is a flow diagram of a method according to the invention.

FIG. 3 illustrates a basic process of the invention. For a specific mask pattern, first the image deformations that will occur in imaging it are calculated in step S1. Next, the required corrective aberrations are calculated in step S2 and the table position and mirror position and/or shape changes required to effect these aberrations are calculated in step S3. The calculated changes are applied to the projection system in step S4 before imaging takes place in step S5. Steps S1 to S3 may be carried out in advance of a projection and the results transferred to the lithographic projection system when required. If the image deformations vary across the pattern to be imaged and the relevant actuators are sufficiently responsive, the relevant changes may be applied during an imaging scan as well as in advance of it.

Figure 4:
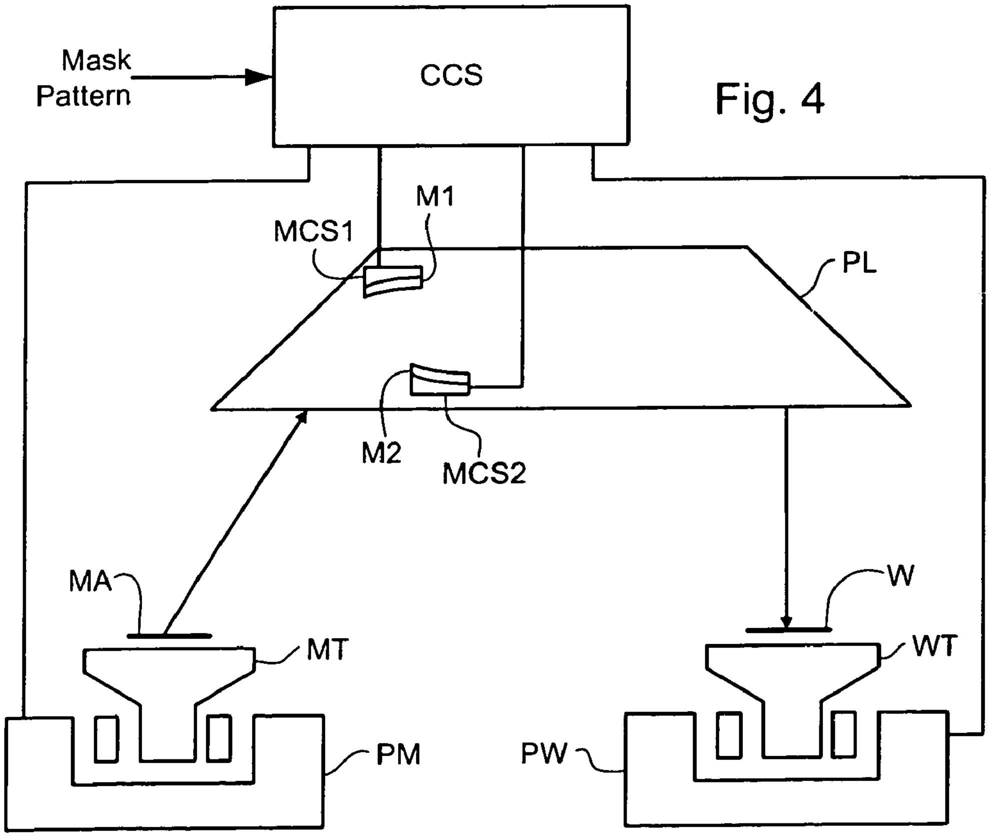
FIG. 4 is a diagram of a system for applying corrections determined in the method of the invention.

A system to effect the method of the invention is shown in FIG. 4. The mask pattern data or precomputed settings for the stage and mirror positions and/or shapes are provided to the central control system CCS of the lithographic apparatus. If mask pattern data are provided, the central control system computes the desired settings for the stage and mirror positions and/or shapes. Prior to and/or during a scanned exposure, the central control system controls the mask table MT and substrate table WT positions, via respective positioning system PM, PW, as well as the positions and/or shapes of some or all mirrors M1, M2 in the projection system PL, via respective control system MCS1, MCS2. Only two mirrors in the projection system PL are shown in FIG. 4 however, the projection system may comprise four or more mirrors.

In a preferred embodiment of the invention, the aberrations introduced to control the mask-induced effects are defined by Zernike polynomials Z5 (astigmatism HV), Z9 (spherical aberration) and Z12 (astigmatism HV—higher order). Other aberrations that might be used include Z2 (tilt in X), Z3 (tilt in Y), Z4 (defocus), Z6 (astigmatism 45°/135°), Z7 (coma X), Z8 (coma Y) and Z13 (astigmatism 45°/135°—higher order). These polynomials take the form:

Z2: $r\cdot\cos(\theta)$

Z3: $r\cdot\sin(\theta)$

Z4: $2\cdot r^2-1$

Z5: $r^2\cdot\cos(2\cdot\theta)$

Z6: $r^2\cdot\sin(2\cdot\theta)$

Z7: $(3\cdot r^3-2\cdot r)\cdot\cos(\theta)$

Z8: $(3\cdot r^3-2\cdot r)\cdot\sin(\theta)$

Z9: $6\cdot r^4-6\cdot r^2+1$

Z12: $(4\cdot r^4-3\cdot r^2)\cdot\cos(2\cdot\theta)$

Z13: $(4\cdot r^4-3\cdot r^2)\cdot\sin(2\cdot\theta)$

Z4 can be used to correct a focus shift independent of structure size and type. Z6 and Z13 have the same effect on the difference between 45° and 135° degree lines as do Z5 and Z12 on the difference between horizontal and vertical lines. Z5 and Z6 are equally important in correcting contact hole ellipticity. Z7 and Z8 affect horizontal and vertical lines respectively.

Higher order aberrations may also be employed to improve control if desired and/or feasible.

It is noted that Zernike polynomials may be expressed in different forms, for example with and without normalization coefficients, and may be numbered in various sequences, e.g. increasing in order of angle then radius or vice versa. Also, other forms for the expression of aberrations are known, e.g. Seidel aberration polynomials. The present invention is not limited to a particular form of expression of the aberrations introduced and embraces the calculation of and addition of aberrations expressed in other forms.

EXAMPLE 1

An example of the invention, which has been simulated, will now be described.

Images without aberration—pure—were simulated for both horizontal and vertical lines at dense and semi isolated for 30 nm and 50 nm features. Due to the simulator software, horizontal lines had to be simulated as vertical, but corrections in aberration sensitivity have been made for this. Best Focus shifts and Isofocal Tilt were calculated.

More simulations were then performed for the same features with 1 nm of a single aberration input. Analysis of Best Focus shifts and Isofocal Tilts were repeated. Sensitivity data was calculated for each feature and aberration combination. Sensitivity is equal to the change in a parameter due to (+)1 nm of an aberration. (For best focus shift the sensitivity units are nm/nmaberration and for isofocal tilt, nm/μm focus /nm aberration). Only Solid-EUV™ relative sensitivities for aberrations are considered here for optimization purposes i.e. changes in best focus shift or isofocal tilt relative to the position of the "pure" image. These results best describe the baseline before aberration input and are often the standard technique for assessing process windows. Note that the positive and negative shift positions, and associated sensitivities, are described here in terms of the system coordinates.

The present invention aims to position the focus shifts and isofocal tilt values to remove the differences between horizontal and vertical features, and between dense and isolated features, thus allowing overlap of the process windows and enabling a wider range of simultaneous imaging. Ideally, all features, of different shapes, linewidths, pitches (whether isolated or dense) and orientations should have a common best focal plane, i.e. all best focus shift values are the same, and an iso-focal tilt of zero. Each Zernike aberration works on different feature types and orientations in a different way. By programming a spreadsheet (such as, e.g., Microsoft Excel) to automatically plot the resultant position after interaction with a single Zernike or several Zernikes, it is possible to experiment with different combinations and levels of Zernike input, to flatten out the plots (removing pitch dependence) and to bring the H and V plots closer together. Zernikes can be input in either the positive or negative directions in the system.

As an example of the method employed, 30 nm lines on a bright field mask were considered. The initial best focus shift and isofocal tilt results for pure images for normal incidence, equivalent to system vertical lines, and 6° incidence, equivalent to system horizontal lines, are shown below for different pitches. Also detailed are the calculated sensitivity values with respect to Z5 and Z12 astigmatism and Z9 spherical for normal and 6° incidence. These Zernikes can be adjusted in a lithographic projection apparatus.

TABLE 1

BFshifts and IFT: pure images, starting values

| | BFshift_V | BFshift_H | IFT_V | IFT_H |
|---|---|---|---|---|
| pitch 60 nm (D) | −5 | 10 | −0.5 | −0.5 |
| pitch 150 nm (I) | 5 | 20 | 8 | 8.5 |

TABLE 2

Relative Sensitivities (in system co-ordinates)

| | BFshift | | | | IFT | | | |
|---|---|---|---|---|---|---|---|---|
| | dense | | iso | | dense | | iso | |
| | N | 6 | N | 6 | N | 6 | N | 6 |
| Z5 | −25 | 40 | −25 | 40 | 0 | 0.5 | −0.5 | 0 |
| Z12 | −5 | 20 | 15 | −25 | −1.5 | 1.5 | 6 | −5.5 |
| Z9 | 20 | 5 | 55 | 60 | −1.5 | −1.5 | 11 | 6.5 |

Figure 5:
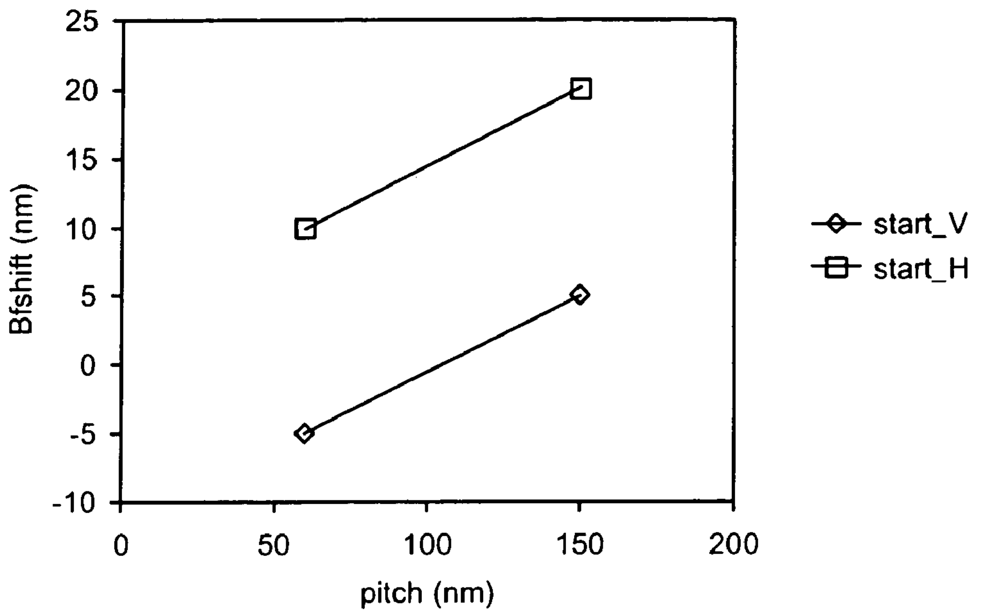
FIG. 5 is a graph of best focus shift vs. pitch for 30 nm lines on a bright field without any correction according to the invention being applied.
Figure 6:
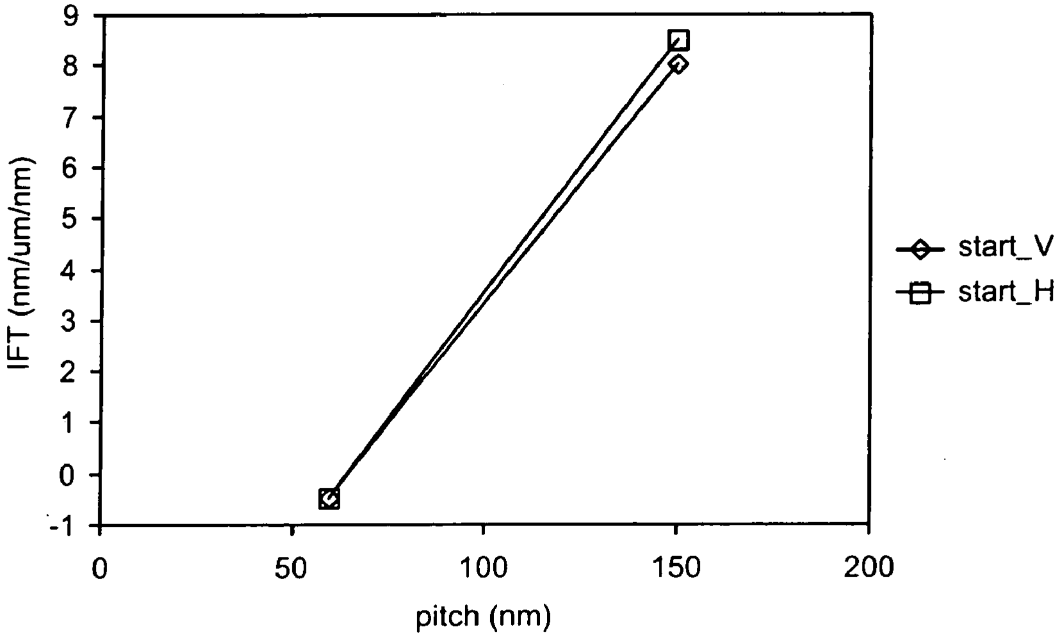
FIG. 6 is a graph of isofocal tilt vs. pitch for 30 nm lines on a bright field without any correction according to the invention being applied.

When plotted, the starting positions for BFshift and IFT appear as shown in FIGS. 5 and 6. The differences in parameters between dense and isolated lines and between horizontal and vertical lines are clearly visible.

The best results so far for 30 nm and 50 nm bright field lines are shown in FIGS. 7 to 17, together with the effect on IFT, which such a correction would trigger. Note that from the starting position Zernikes are added in the order of the graph legend, thus the last Zernike in the list is the final position of the BF and IFT plots and a summation of all Zernike inputs.

Figure 7:
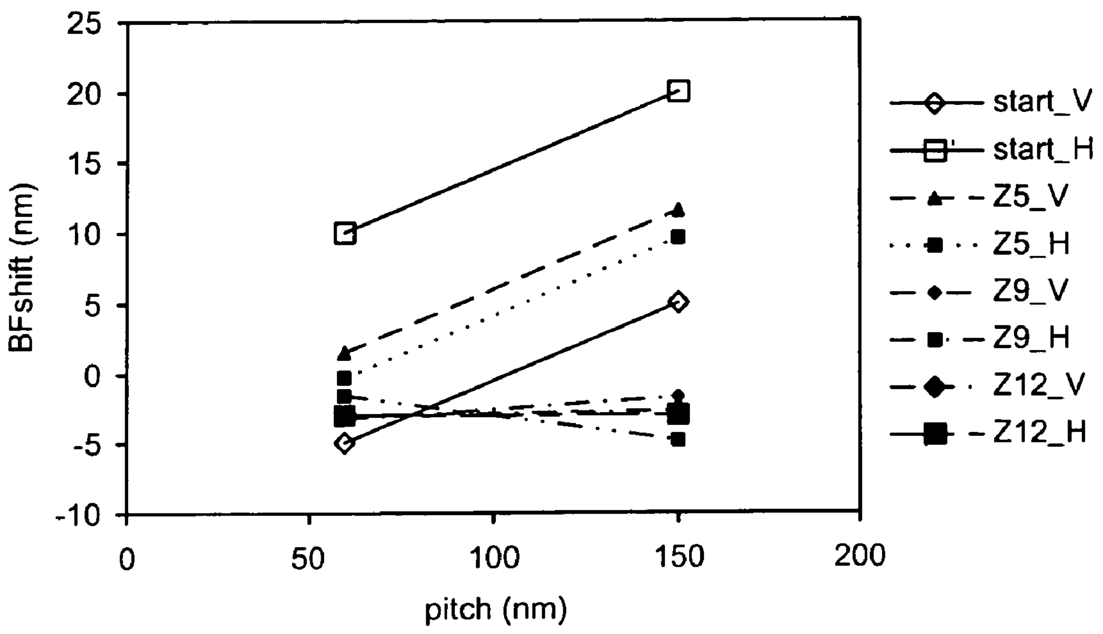
FIGS. 7 to 11 are graphs showing the effects on best focus shift and isofocal tilt with various degrees of correction according to the method of the invention.
Figure 8:
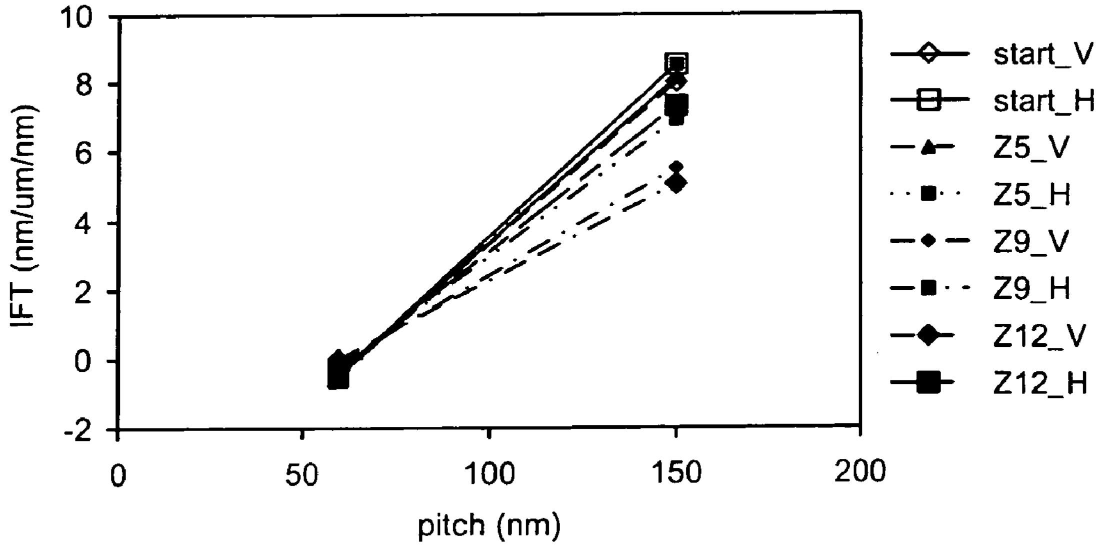

FIG. 7 shows the effect of adding aberrations to correct for best focus shift due to the mask. The values of the Zernike aberrations added were: Z5=−0.26 nm, Z9=−0.24 nm and Z12=−0.07 nm. FIG. 8 then illustrates the effect of the correction on isofocal tilt. A clear improvement can be seen—both the best focus shift and isofocal tilt become less dependent on pitch after the corrective aberrations are introduced.

The best results obtained for different features are shown in Table 3 below:

| | Z5 (nm) | Z9 (nm) | Z12 (nm) | starting focus range (nm) | resulting focus range (nm) | starting IFT maxvalue | IFT max after BF correction |
|---|---|---|---|---|---|---|---|
| 30 nm | −0.26 | −0.24 | −0.07 | 25 | 0 | 8.5 | 7.3 |
| 50 nm | −0.18 | −0.22 | −0.18 | 15 | 0 | 10.5 | 7.8 |

Figure 9:
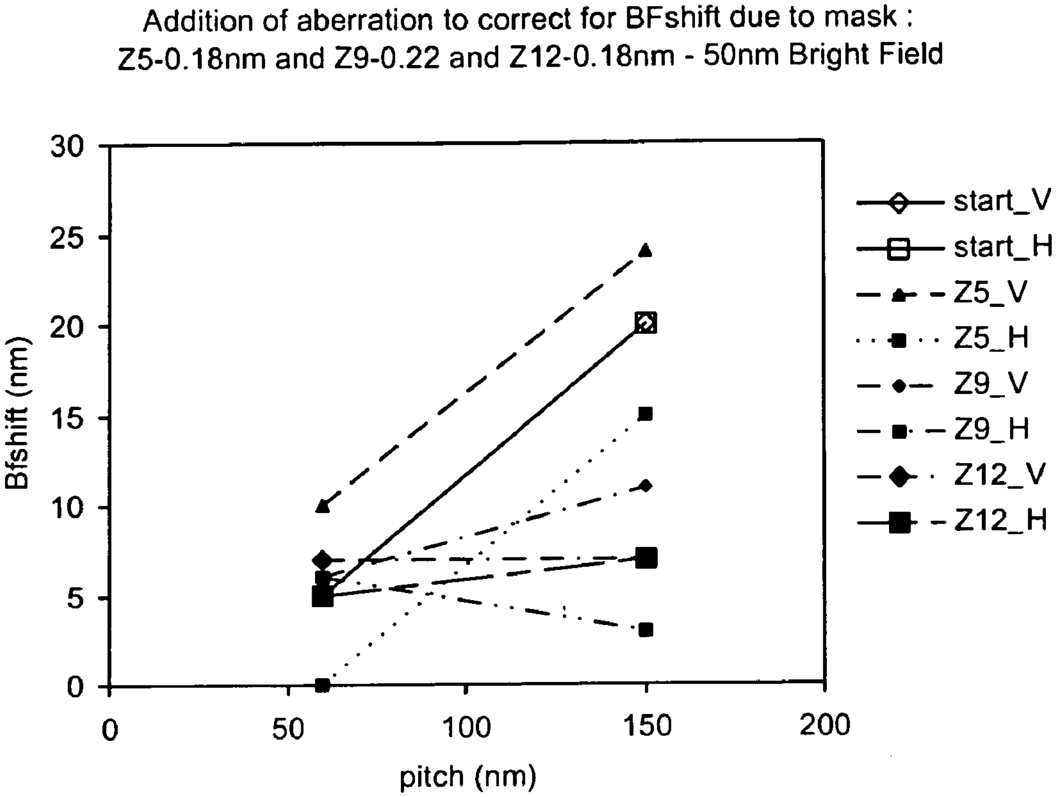

Comparing FIGS. 7 and 9, illustrates the improvements obtained for 30 nm and 50 nm lines in a bright field.

Of course it is also possible to optimize for IFT. However, this results in a different set of aberration inputs and thus affects the BFshift positions. Examples for 30 nm and 50 nm lines on bright field mask are shown in Table 4 below:

| | Z5 (nm) | Z9 (nm) | Z12 (nm) | starting focus range (nm) | resulting focus range (nm) | starting IFT maxvalue | IFT max after BF correction |
|---|---|---|---|---|---|---|---|
| 30 nm | −0.4 | −0.55 | 0.11 | 25 | 25 | 8.5 | 4.3 |
| 50 nm | −0.34 | −0.37 | −0.11 | 15 | 15 | 10.5 | 6.1 |

Figure 10:
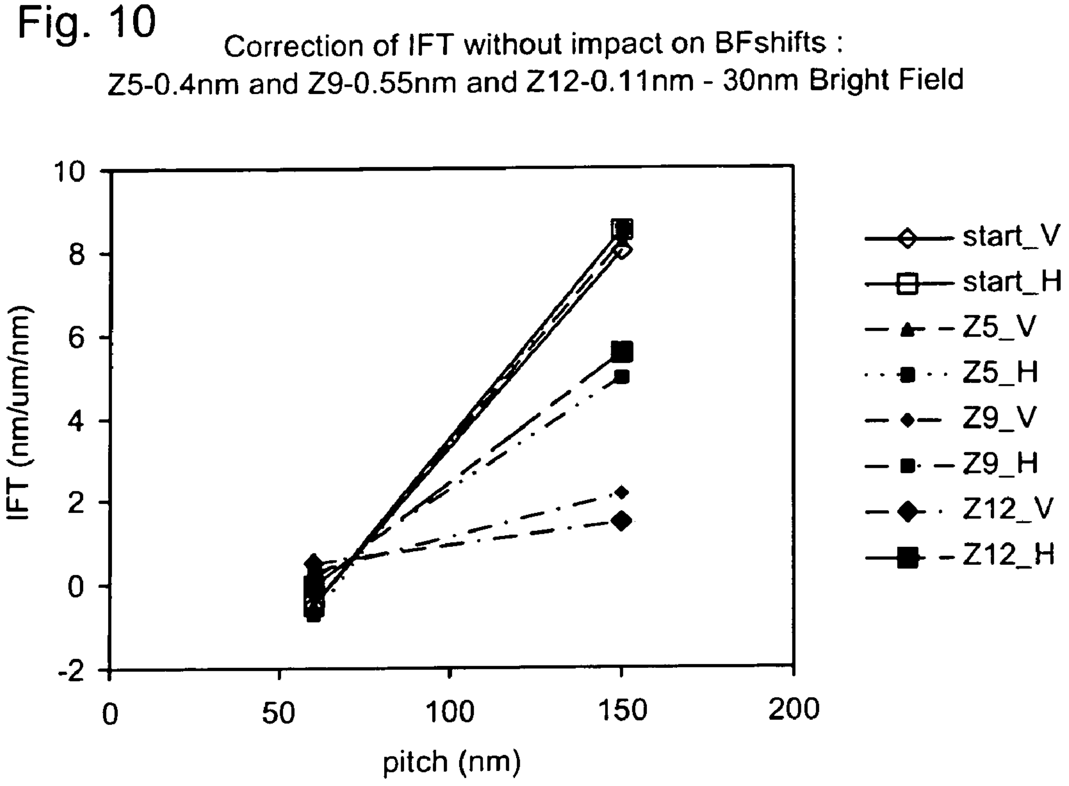
Figure 11:
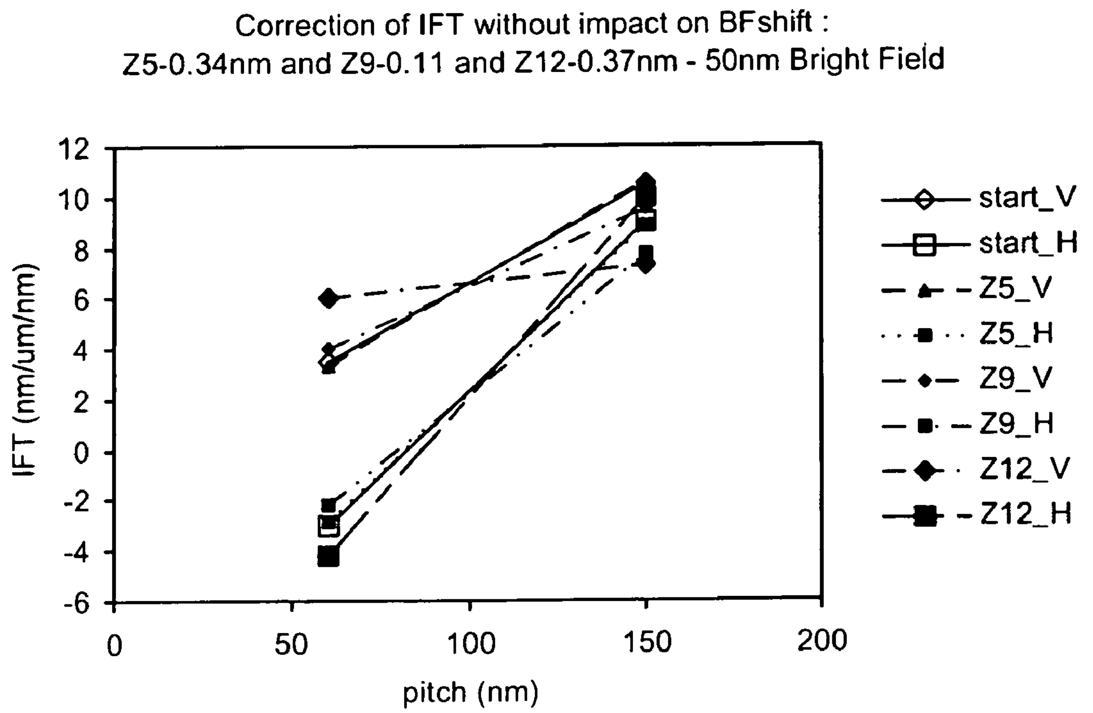

These results are shown in FIGS. 10, for 30 nm lines, and 12, for 50 nm lines.

It is further possible to search for a combination of aberrations that give the best solution for both best focus shift and isofocal tilt, which involves weighting the relative importance of best focus shift and isofocal tilt.

The above examples demonstrate that it is possible to compensate for BF shift effects due to a reflective mask and oblique illumination in such a way that BF shift differences between dense and isolated lines, and between horizontal and vertical lines, can be reduced. This will assist in bringing process windows for different features closer together. It is also possible to use IFT as the metric for level of aberration input and reduce the differences between different structure types. The choice of metric is important as improvement in IFT may worsen BF shift performance, and visa versa.

To confirm the usefulness of the invention, using the adjustments described above, images in resist were simulated to investigate the effect of correction of BF shifts on CDU (Critical Dimension Uniformity). Prolith™ was used for simulation with the EUV-2D resist model, resist thickness 120 nm. A CDU prediction model used the resist images as a base and, together with user inputs of focus and energy budgets, calculated the resultant CDU performance for various focus ranges. FIGS. 12 to 16 clearly show that altering the IFT and BF parameters enhances the CDU performance, thus indicating the relevance of BF shift and IFT correction by aberration input.

Figure 12:
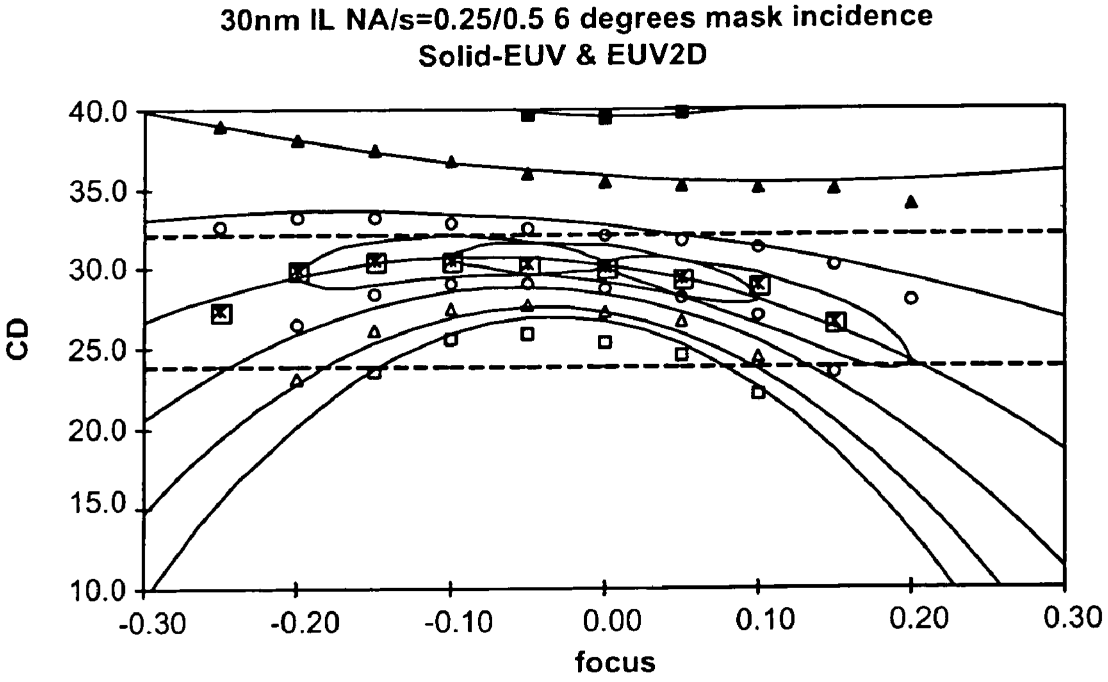
FIGS. 12 to 15 are graphs of critical dimension vs. focus for various illumination conditions and degrees of correction.

FIG. 12 shows the simulated CD response in resist versus energy and focus for 30 nm isolated lines printed with NA=0.25, $\sigma$=0.5 and 6 degrees MAI, thus representing the horizontal lines. In the graph, the three elliptically shaped CD contours indicate the CD variation as function of system energy and focus errors. Each CD contour has represents a different focus setting, 0 and +/−100 nm. The CD response in FIG. 12 shows a mask-induced isofocal tilt leading to poor CD uniformity.

Figure 13:
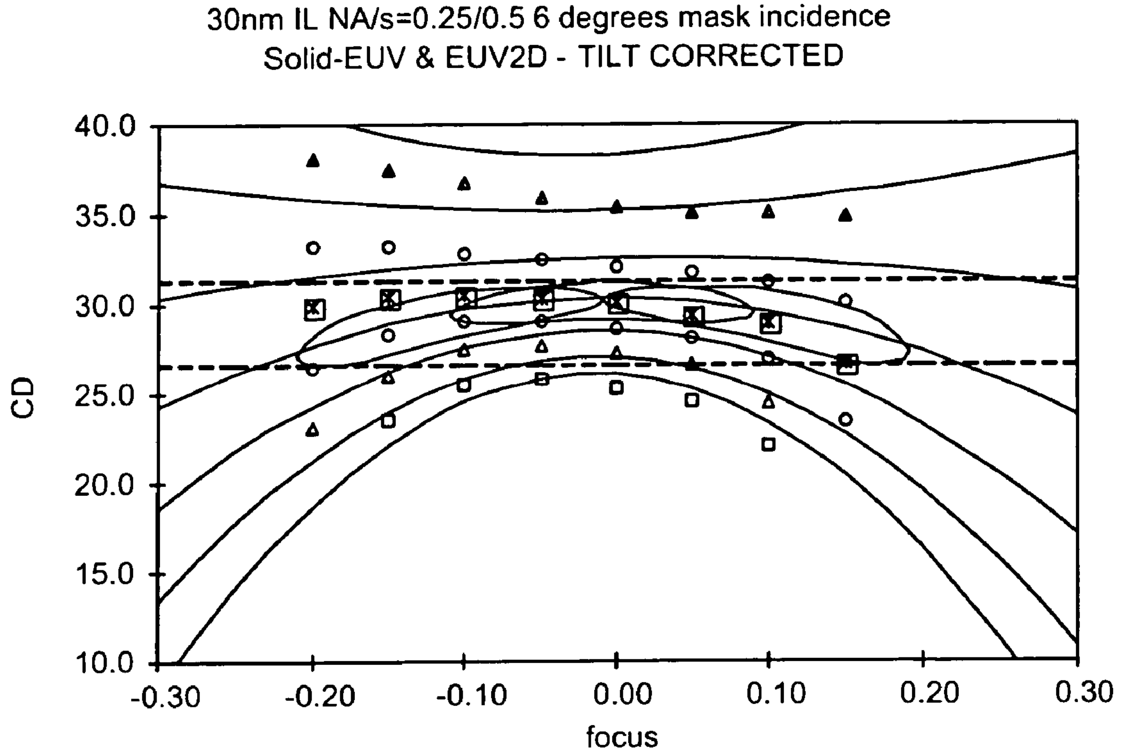
Figure 14:
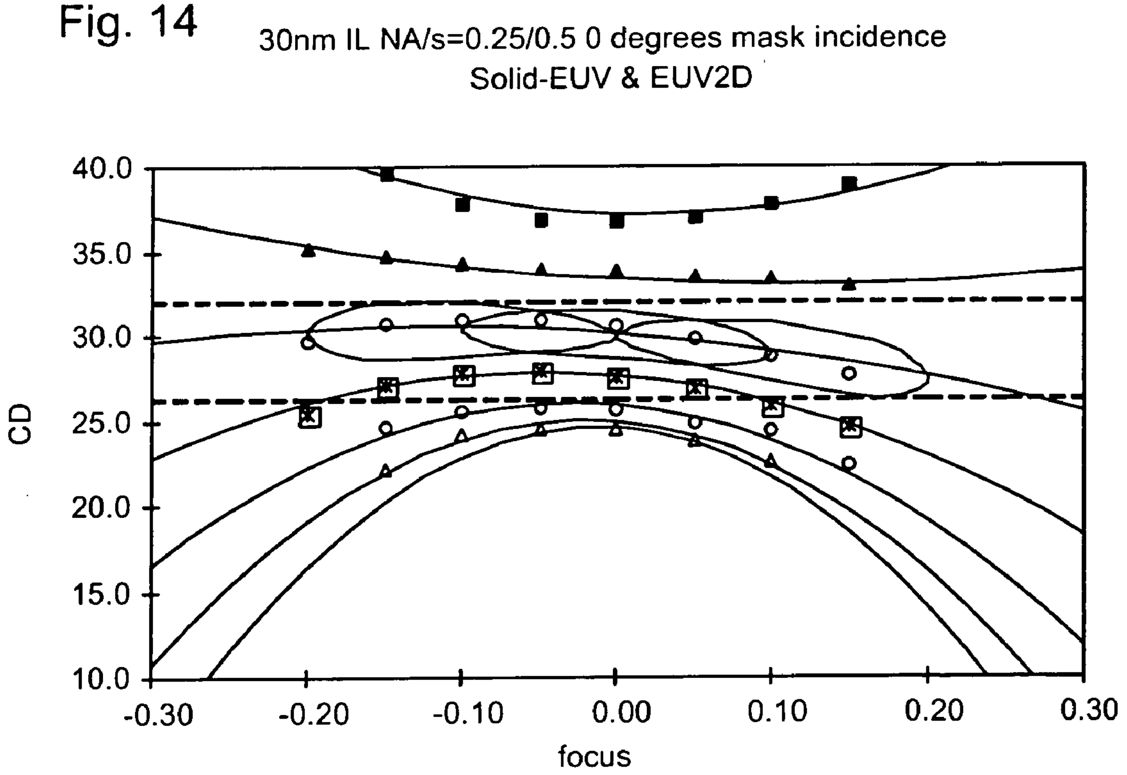
Figure 15:
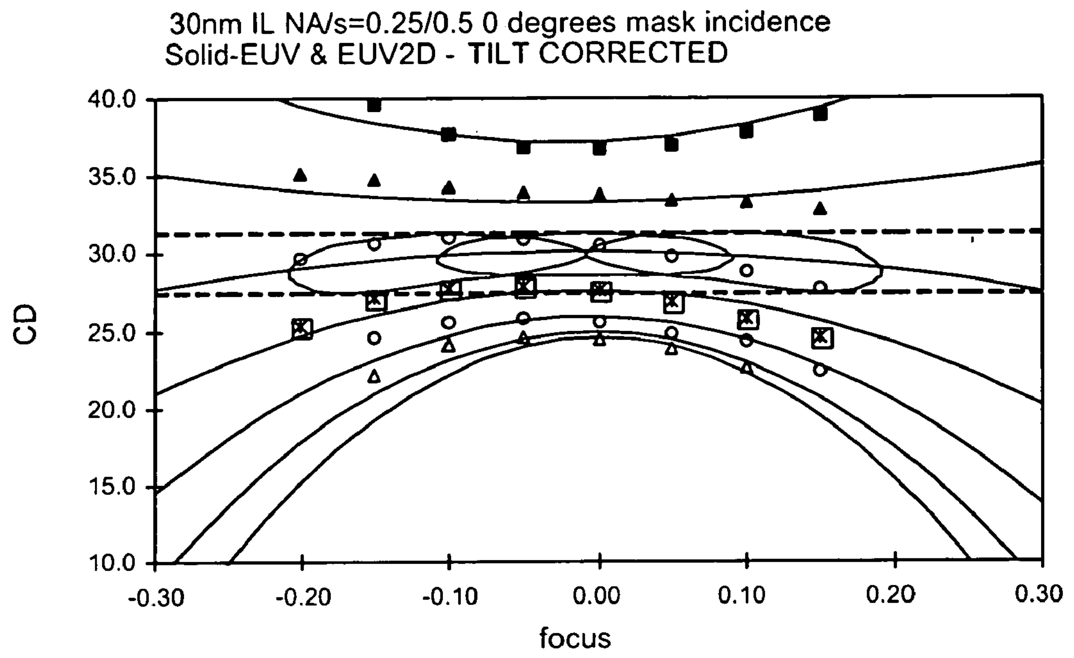

FIG. 13 shows the CD response versus energy and focus that is mathematically corrected for the isofocal tilt. The three CD contours show less CD variation indicating that this tilt correction improves CD uniformity. FIG. 14 shows the CD response in resist for 0 degrees MAI presenting the vertical lines. FIG. 15 shows that again isofocal tilt correction improves CDU.

Figure 16:
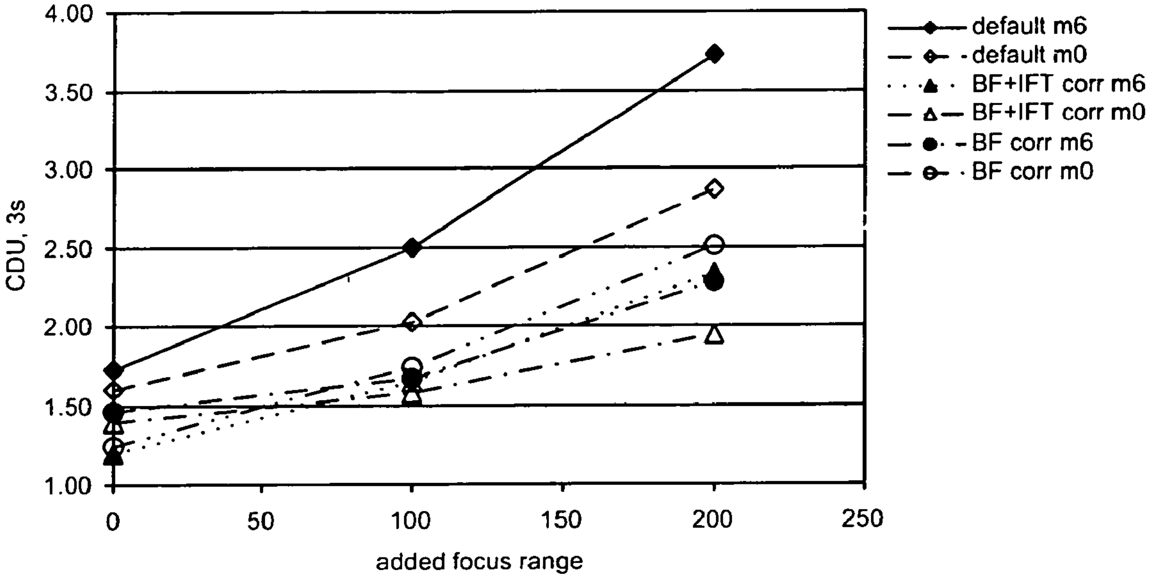
FIG. 16 is a graph of critical dimension uniformity vs. added focus range for illumination conditions and degrees of correction.

FIG. 16 combines all CDU information of FIGS. 12–15. The predicted CDU is plotted against the focus range. The impact of the mathematical best focus (BF) and isofocal tilt (IFT) correction on CDU are shown. For example, the CDU for 0 nm focus range is based on the black CD contours where the best focus is set at 0 nm. The CDU for 200 nm focus range is based no all three CD contours for the 0 and +/−100 nm focus settings.

The Figure shows that the CDU can be improved substantially by BF and IFT correction for both horizontal and vertical lines. The CDU improves most for the largest focus range.

EXAMPLE 2

As a follow up to the first example, which addressed mask-induced focus related effects and solutions (Z plane), a second example addressed the mask-induced image CD and displacement effects and methods to compensate these (X-Y plane). The simulations results described here are based on the same Solid-EUV™ produced aerial images as in the first example. These aerial images were imported into Prolith™ v7.1 to calculate the image CD and displacement.

As function of mask angle of incidence (MAI), absorber thickness, feature type and NA/illumination setting a mask induced image CD offset will occur. The dominant effect is a CD variation between features as function of structural orientation such as a HV bias. For contact holes, the mask will induce ellipticity.

Figure 17:
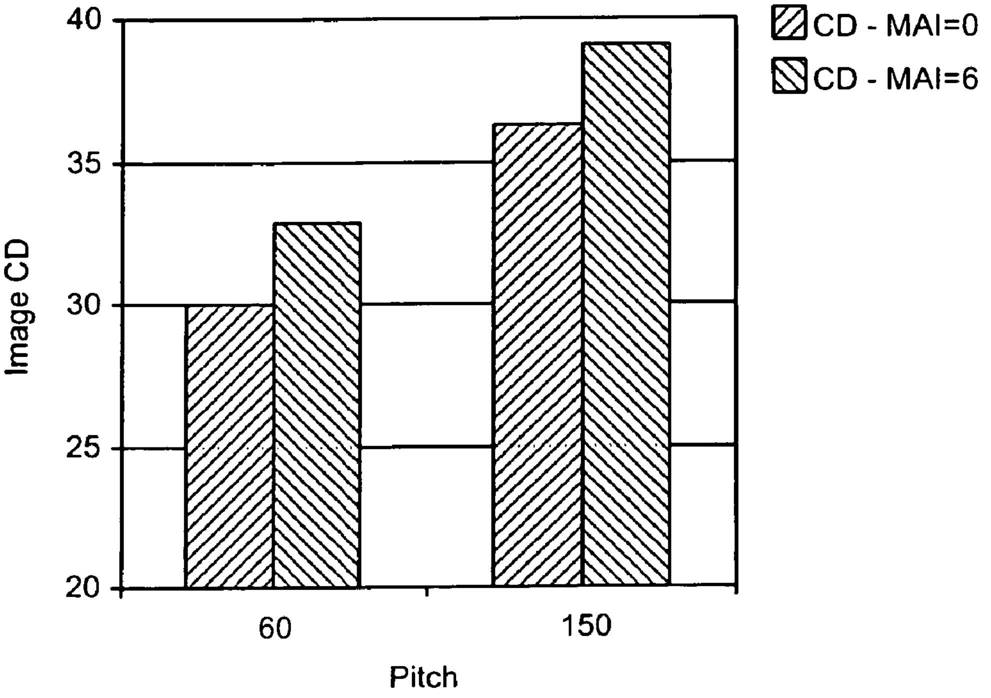
FIG. 17 is a graph of image critical dimension as a function of mask angle of incidence and pitch.

FIG. 17 shows image CD as function of MAI and pitch for 30 nm lines with NA=0.25, $\sigma$=0.5. It can be seen that the CD bias between MAI of 0 and 6 degrees is 2.9 nm for dense lines and 2.8 nm for (semi)isolated lines. This information yields a sensitivity of 0.5 nm CD/degree MAI.

Figure 18:
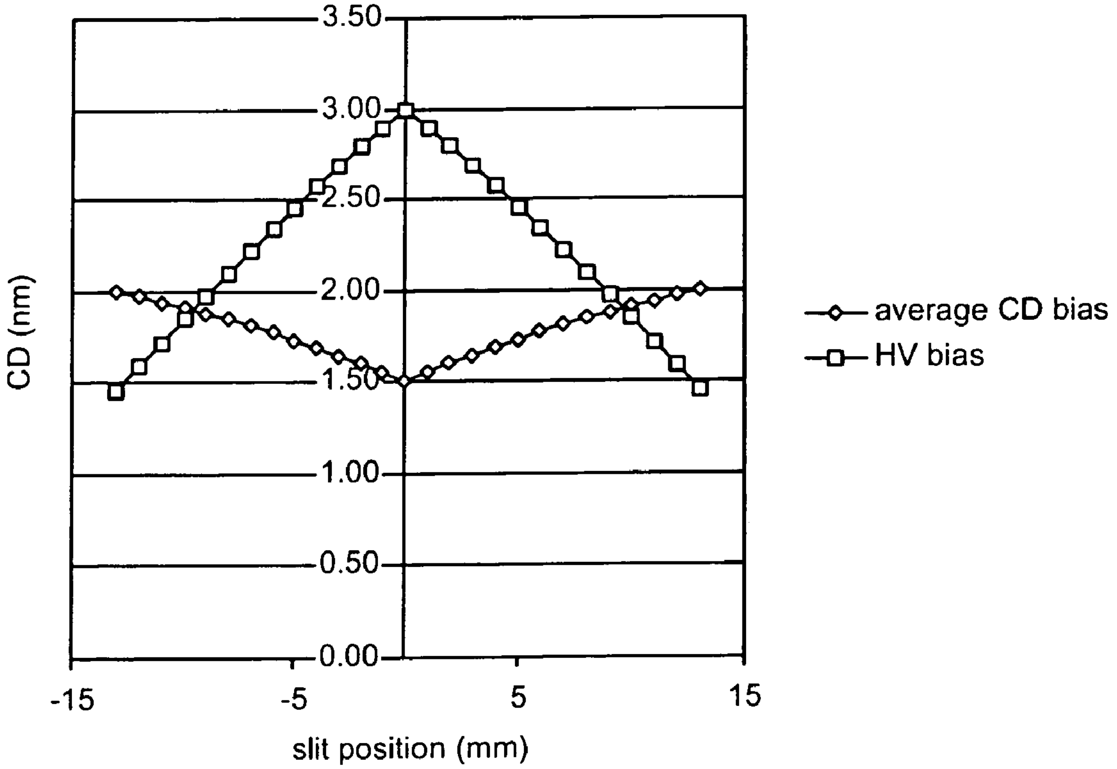
FIG. 18 is a graph of mask-induced critical dimension and horizontal-vertical bias as a function of position in the image field.

FIG. 18 shows mask-induced CD and HV bias as function of slit position, based on the MAI variation for horizontal and vertical lines and the CD sensitivity to MAI. The issues are the HV bias, the HV bias and average CD variation across the slit.

The consequent mask-induced contact hole ellipticity variation across the slit may be compensated by projection lens aberrations, most notably astigmatism (Z5). The HV bias can be compensated in combination with the BF and IFT compensation by optimized project lens aberration settings, most notably Z5, Z9 and Z12.

Figure 19:
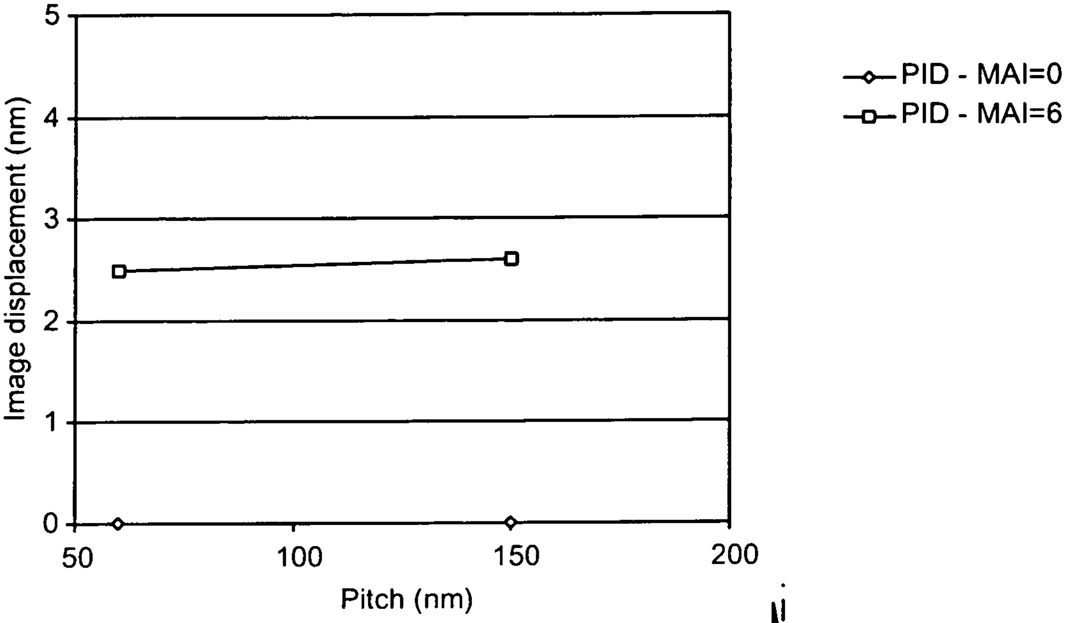
FIG. 19 is a graph of image displacement as a function of mask angle of incidence and pitch.

As function of mask angle of incidence (MAI), absorber thickness, feature type and NA/illumination setting a mask induced image displacement will occur. As with the image CD effects, the image displacement induced by the mask will be slit position dependent. FIG. 19 shows image displacement as function of MAI and pitch for 30 nm lines with NA=0.25, $\sigma$=0.5, demonstrating a strong bias between horizontal features, for which the mask angle of incidence is 6°, and vertical features for which the mask angle of incidence is 0°. This effect can be compensated for by the introduction of aberrations Z2, Z3 and Z7, where:

$$Z2=r\cos\theta$$

$$Z3=r\sin\theta$$

$$Z7=(3r^3-2r)\cos\theta$$

Mask Angle of Incidence

The term “mask angle of incidence” as used above can be explained with reference to FIGS. 20 to 22.

Figure 20:
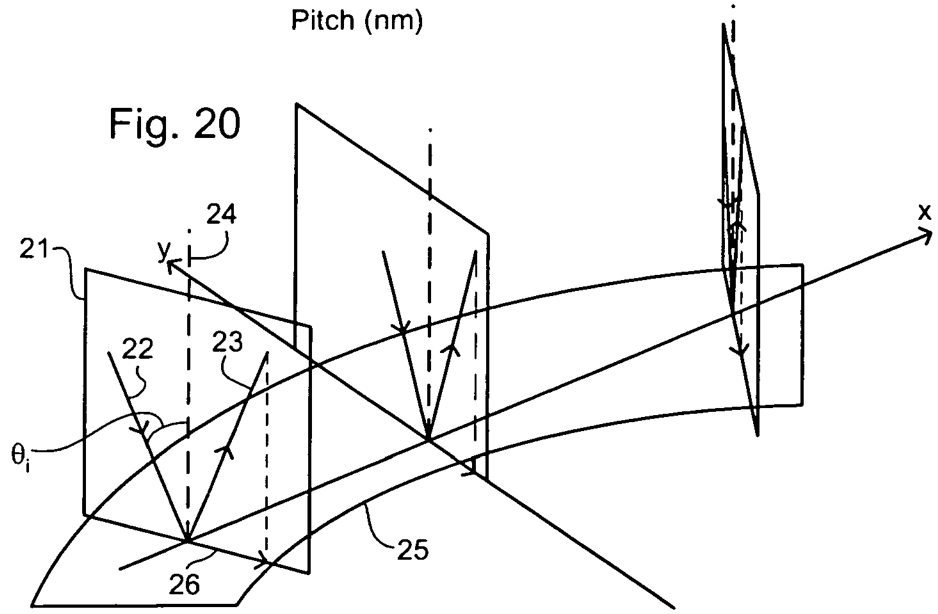
FIGS. 20 to 22 are diagrams used to explain the mask angle of incidence.
Figure 21:
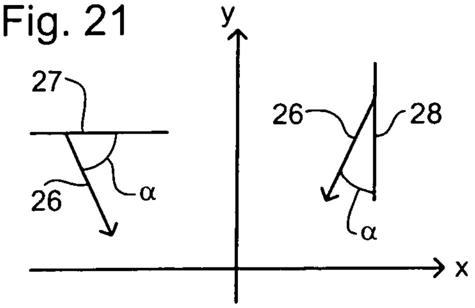
Figure 22:
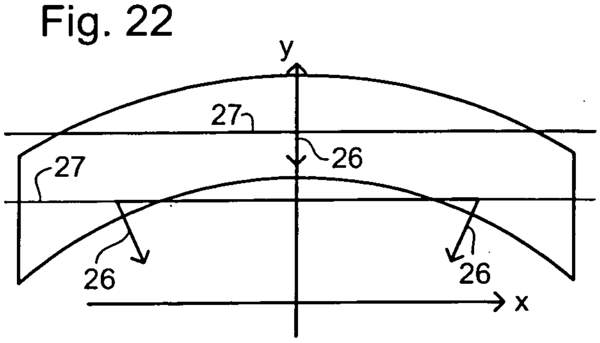

In FIGS. 20 to 22, the following reference numerals are used:

21 plane of incidence;

22 incident central illumination ray;

23 reflected central patterned ray;

24 normal to plane of pattern;

25 arcuate (part-annular) illumination area on plane of pattern;

26 component of reflected central patterned ray, in the plane of the pattern;

27 horizontal feature;

28 vertical feature; and $\alpha$ angle between feature and component of reflected central patterned ray.

The mask angle of incidence MAI is defined in the present text and claims as $$MAI=(\alpha/90°)*\theta_i$$

In an EUV projection apparatus, the illuminated field 25 is typically arcuate, and incident central rays of illumination 23 lie in planes of incidence 21 which intersect each other along a line (not shown in FIG. 20) perpendicular to the x,y plane in FIG. 20, intersecting the y-axis. As a consequence, the corresponding reflected central patterned rays have components 26 in the x,y plane converging to a point (not shown in FIG. 20) on the y-axis. The shadowing effect of the thick absorber depends on the angle a between a feature and the component 26 of the reflected central patterned ray 23 at the position of that feature. In FIG. 21 this angle is shown for a horizontal feature 27 and a vertical feature 28. From FIG. 22, which shows this angle for horizontal features 27 at different x positions, it is clear that the angle $\alpha$ varies in accordance with the position of the feature along the x-axis. Thus, in general, the shadowing effect is dependent on the position of a feature along the x axis, and consequently lithographic errors exhibit an x dependence in accordance with the variation of $\alpha$. According to the present invention, preferably Z2, Z3, and Z7 (as defined above) are controlled to correct for lithographic errors related to above mentioned x-dependent shadowing effect.

While specific embodiments of the invention have been described above, it will be appreciated that the invention may be practiced otherwise than as described. The description is not intended to limit the invention.

The invention claimed is:

1. A device manufacturing method comprising:

patterning a beam of radiation using a reflective mask on which a pattern is defined by a radiation absorber;

projecting the patterned beam of radiation onto a target portion of a layer of radiation-sensitive material on a substrate using a projection system; and controlling system aberrations in the projection system used in said projecting to compensate for mask-induced imaging artifacts, so that values of at least one imaging metric for different feature types appearing in said pattern are brought closer together.

2. A method according to claim 1, wherein the radiation absorber is thick relative to a wavelength of the patterned beam of radiation.

3. A method according to claim 2, wherein the imaging artifacts result, at least in part, as a result of the thickness of the radiation absorber.

4. A method according to claim 1, further comprising calculating for said pattern, optimum aberrations to be effected in said projection system, taking account one or more parameters to be used in said projecting, said parameters being selected from the group comprising mask angle of incidence (MAI), absorber thickness, absorber material, feature type, numeral aperture, and illumination settings.

5. A method according to claim 1, wherein said system aberrations comprise one or more of Zernike polynomials Z2 (tilt in X), Z3 (tilt in Y), and Z7 (coma X), where these polynomials take the form:

Z2: $r\cdot\cos(\theta)$

Z3: $r\cdot\sin(\theta)$

Z7: $(3\cdot r^3-2\cdot r)\cdot\cos(\theta)$

6. A method according to claim 1, wherein said at least one imaging metric is selected from the group comprising: best focus shift, isofocal tilt, critical dimension, critical dimension uniformity, overlay, telecentricity, pattern asymmetry, pitch linearity and iso-dense bias.

7. A method according to claim 1, wherein said different features have different densities, different orientations and/or different critical dimensions.

8. A method according to claim 1, wherein said aberrations are introduced so as to bring process windows for said different features closer together.

9. A method according to claim 1, wherein said system aberrations comprise one or more of Zernike polynomials Z4 (defocus), Z5 (astigmatism HV), Z6 (astigmatism 45°/135°), Z8 (coma Y), Z9 (spherical aberration), Z12 (astigmatism HV—higher order) and Z13 (astigmatism 45°/135°—higher order), where these polynomials take the form:

Z4: $2\cdot r^2-1$

Z5: $r^2\cdot\cos(2\cdot\theta)$

Z6: $r^2\cdot\sin(2\cdot\theta)$

Z8: $(3\cdot r^3-2\cdot r)\cdot\sin(\theta)$

Z9: $6\cdot r^4-6\cdot r^2+1$

Z12: $(4\cdot r^4-3\cdot r^2)\cdot\cos(2\cdot\theta)$

Z13: $(4\cdot r^4-3\cdot r^2)\cdot\sin(2\cdot\theta)$

10. A method according to claim 4, wherein said calculating further comprises:

determining sensitivities of different features in said pattern to different aberrations; and determining optimum combination of aberrations using the determined sensitivities.

11. A method according to claim 10, wherein said sensitivities are determined by simulating images of said different features with at least one of different amounts and combinations of aberrations.

12. A computer readable medium having executable instructions stored therein that, when executed on a computer system, instruct the computer to perform a method comprising:

determining sensitivities of different features in a mask pattern on a reflective mask to different aberrations;

determining the optimum combination of aberrations using the determined sensitivities so that values of at least one imaging metric for different features in the mask pattern are brought closer together.

13. A computer readable medium according to claim 12, wherein said instructions comprise instructions for simulating images of said different features with at least one of different amounts and combinations of aberrations to effect said determining the sensitivities.

14. A computer readable medium according to claim 12, wherein said at least one imaging metric is selected from the group comprising: best focus shift, isofocal tilt, critical dimension, critical dimension uniformity, overlay, telecentricity, pattern asymmetry, pitch linearity and iso-dense bias.

15. A computer readable medium according to claim 12, wherein said different features are at least two features selected from the group consisting of dense and isolated lines, horizontal and vertical lines, and/or lines of different widths.

16. A computer readable medium according to claim 15, wherein said instructions are adapted to determine optimum aberrations to be effected so as to bring process windows for said different features closer together.

17. A computer readable medium according to claim 12, wherein said system aberrations are Zernike polynomials Z2 (tilt in X), Z3 (tilt in Y), and Z7 (coma X), where these polynomials take the form:

Z2: $r\cdot\cos(\theta)$

Z3: $r\cdot\sin(\theta)$

Z7: $(3\cdot r^3-2\cdot r)\cdot\cos(\theta)$.

18. A computer readable medium comprising:

a computer code having machine executable instructions, said machine executable instructions adapted to control a lithographic projection apparatus to effect system aberrations in the projection system of the lithographic projection apparatus so as to optimize imaging of a reflective mask embodying a mask pattern in a thick absorbers wherein said optimizing includes bringing values of at least one imaging metric for different feature types in the mask pattern closer together.

19. A computer readable medium according to claim 18, wherein said system aberrations are Zernike polynomials Z2 (tilt in X), Z3 (tilt in Y), and Z7 (coma X), where these polynomials take the form:

$$Z2: r \cdot \cos(\theta)$$

$$Z3: r \cdot \sin(\theta)$$

$$Z7: (3 \cdot r^3 - 2 \cdot r) \cdot \cos(\theta).$$

* * * * *